United States Patent [19]

Kollmannsberger et al.

[11] Patent Number: 4,542,374
[45] Date of Patent: Sep. 17, 1985

[54] SWITCHING CIRCUIT FOR SUPERVISING THE DEGREE OF WEAR OF COMMUTATOR-CONTACTING CARBON BRUSHES

[75] Inventors: Otto Kollmannsberger, Moosburg; Martin Schmid, Niederhornbach, both of Fed. Rep. of Germany

[73] Assignee: Steinbock GmbH, Moosburg, Fed. Rep. of Germany

[21] Appl. No.: 476,194

[22] Filed: Mar. 17, 1983

[30] Foreign Application Priority Data

Mar. 26, 1982 [DE] Fed. Rep. of Germany ....... 3211251

[51] Int. Cl.$^4$ .............................................. G08B 21/00
[52] U.S. Cl. .................................... 340/648; 310/245; 340/52 D; 340/679
[58] Field of Search ...................... 340/679, 648, 52 D, 340/52 R; 310/245

[56] References Cited

U.S. PATENT DOCUMENTS 3,609,429 9/1971 Thompson .
4,024,525 5/1977 Baumgartner et al. .
4,316,186 2/1982 Purdy et al. ........................ 340/648

FOREIGN PATENT DOCUMENTS 1804290 5/1970 Fed. Rep. of Germany .
2605114 11/1977 Fed. Rep. of Germany .

Primary Examiner—Glen R. Swann, III
Attorney, Agent, or Firm—Collard, Roe & Galgano

[57] ABSTRACT

In a circuit for supervising the wear of carbon brushes making normally contact with a commutator of a direct-current electric motor of an electrically operated vehicle powered by an accumulator, and which includes main on-off switch for starting and stopping the vehicle, electrically insulated control brushes carried by the carbon brushes, and movable therewith, and a warning signal indicator normally connected to the control brushes, which provides a selectable optical and acoustic warning signal when the control brushes establish contact with the commutator upon a predetermined degree of wear of the carbon brushes, the improvement includes an electrical memory which has set and reset inputs, is connected to the control brushes, and controls the warning signal indicator. The control brushes set the memory upon establishing contact with the commutator. A switching device switches the warning signal indicator into, and out of the circuit, and the memory, upon being set, automatically actuates the switching device for switching the warning signal indicator into the circuit, independently of the establishment of the contact of the control brushes with the commutator; the memory is reset upon actuation of the main on-off switch.

1 Claim, 1 Drawing Figure

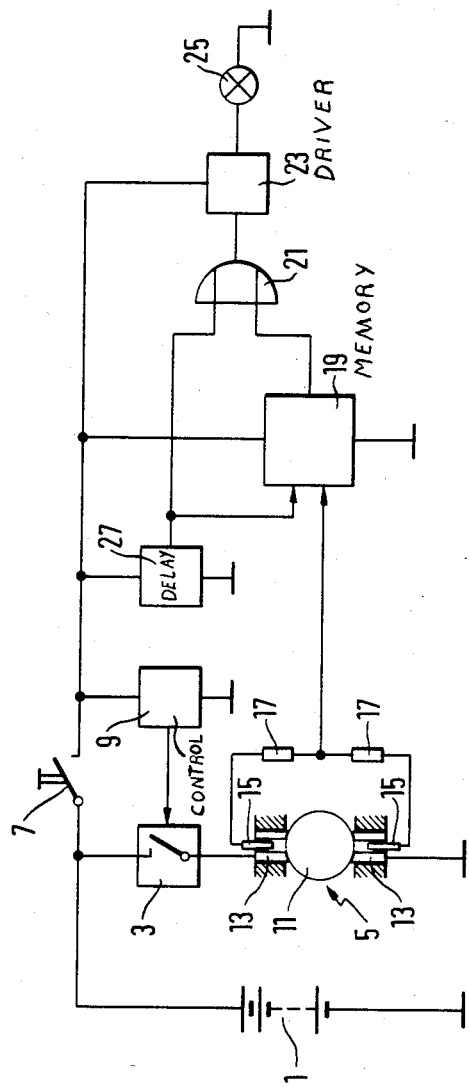

SWITCHING CIRCUIT FOR SUPERVISING THE DEGREE OF WEAR OF COMMUTATOR-CONTACTING CARBON BRUSHES

BACKGROUND OF THE INVENTION

1. Field of the Invention

The invention relates to a circuit for supervising the degree of wear of commutator-contacting carbon brushes of a direct current electric motor of an electrically operated vehicle, particularly of a forklift, powered by an accumulator, wherein the carbon brushes carry electrically insulated control brushes movable therewith, and wherein a warning signal indicator is connected to the control brushes, which provides a selectable optical and acoustic warning signal, when the control brushes establish contact with the commutator upon a predetermined degree of wear of the carbon brushes, the warning signal indicator being switched into the circuit upon establishment of such a contact.

2. Description of the Prior Art

In conventional circuits of this type, the warning signal indicator substantially consists of a signaling light, which is connected between the control brushes and one pole of an accumulator of the electrically operated vehicle. When the commutator carbon brushes are worn, the control brushes close the circuit of the signaling light through the armature of the electric motor to the other pole of the accumulator. As the commutator potential changes when the motor is subjected to a fluctuating load, the light intensity of the conventionally used signaling light fluctuates also. The motor circuit is controlled by a gate or an electronic switch, and is interrupted when the vehicle comes to a stop. Consequently, the warning signal light is not operative in those situations during which the driver should concentrate on the indication provided by that warning signal indicator.

SUMMARY OF THE INVENTION

It is therefore one of the objects of the present invention to improve known circuits for supervising the degree of wear of commutator carbon brushes to such a degree that during operation of the electrically operated vehicle there occurs a uniform and continuous indication of any impermissibly high degree of wear of the carbon brushes.

This object is attained, according to the present invention, by providing electrical memory means having set and reset inputs connected to the control brushes, which control the warning signal indicator, and wherein the control brushes set the memory means upon establishing contact with the commutator, and switching means for switching the warning signal indicator into, and out of the circuit, the memory means, upon being set, automatically actuating the switching means for switching the warning signal indicator into the circuit independently of the establishment of the contact of the control brushes with the commutator, and wherein the memory means are reset upon actuation of the main on-off switch, which starts the vehicle.

The memory means is reset by a reset circuit after the vehicle has been started, so that the warning signal indicator is disconnected from the circuit. If, during operation of the vehicle, the control brushes establish contact with the commutator of the electric motor, then the memory means is set, and the warning signal indicator is switched into the circuit. Here it is sufficient if the control brushes make only short-time contact with the commutator, which can particularly take place when the limit of wear of the carbon brushes is imminent. The memory means ensures continuous and uniform control conditions for the warning signal indicator.

In a preferred implementation there are provided delay means precoupled to the warning indicator, which may be actuated by the main switch, and which, upon being actuated, switch the warning signal indicator into the circuit for a predetermined time interval, independently of the establishment of the contact of the control brushes with the commutator. The proper functioning of the warning signal indicator, particularly of its signaling light and the like, can be examined by means of the delay means. When the apparatus functions properly, the signaling light lights up for a predetermined time interval, when the vehicle is started, for example 1–2 seconds, and is then switched off. Advantageously, the memory means are reset by the delay means.

BRIEF DESCRIPTION OF THE DRAWING

Other objects and features of the present invention will become apparent from the following detailed description considered in connection with the accompanying drawing, which discloses several embodiments of the invention. It is to be understood that the drawing is to be used for the purposes of illustration only, and not as a definition of the limits of the invention.

The sole figure of the drawing shows a block schematic diagram of the supervisory circuit for the carbon brushes.

DESCRIPTION OF THE PREFERRED EMBODIMENTS

Referring now to the drawing, the armature circuit 5 of the electric motor of an electrically operated vehicle, particularly of a forklift, is connected through a switch or gate 3 to an accumulator 1. Any switches for reversing the direction of the rotation of the motor, the stator circuit, also connected through the switch or gate 3 to the accumulator, and any control circuits for increasing the velocity of the motor, are not illustrated. All circuits of the electrically operated vehicle are controlled by a main switch 7, for example a key switch or the like. The main switch 7 is closed during operation of the vehicle. It controls particularly the supply of current of a circuit 9, through which the exciting current of the switch or gate 3, or the control current of any electronic switches substituted for the switch 3, passes.

The armature circuit 5 conventionally includes a commutator 11, along which the carbon brushes 13 slide. Each carbon brush 13 carries at a radial distance from the commutator 11 a control brush 15, which is electrically insulated with respect to the commutator carbon brushes 13. If a predetermined degree of wear of the commutator carbon brushes 13 has been reached, then the control brushes 15 also make contact with the commutator 11. The control brushes 15 are connected through decoupling resistors 17, or decoupling diodes or the like to a set input of a memory means 19, which is responsive to any voltage change across the control brushes 15. The memory means 19 controls through an OR gate 21 a driver stage 23 of a signaling light 25. The signaling light 25 is connected, if one of the control brushes 15 makes either short-term or permanent contact with the commutator 11. The driving stage 23 ensures uniform operating conditions of the signaling light 25, and can, if necessary, be implemented by a blinking circuit. The memory means 19 may be implemented as a flip-flop or an electronic switch, which is switched on or off by control impulses.

When the main switch 7 is opened, the circuit supply to the delay memory 19, to the OR gate 21, and to the driving stage 23 is disconnected. Upon start of the vehicle by closure of the main switch 7, the delay means 27 is set, which resets the memory means 19, following elapse of its time constants, and ensures uniform starting conditions. The delay means 27 is connected through the OR gate 21 also to the driver stage 23 of the signaling light 25, and switches on the signaling light 25 for the duration of its time constant. Upon start of the vehicle, the proper functioning of the driver stage 23, and the signaling light 25 can be supervised.

To the extent that the electrically operated vehicle includes a plurality of electric motors, for example, auxiliary power-drive motors, or motors operating pumps of any hydraulic devices, their commutator carbon brushes can be also appropriately supervised. The delay means 27 can be employed for the control of all warning signal indicators, and for the resetting of all delay means.

While only several embodiments of the present invention have been shown and described, it is obvious that many changes and modifications may be made thereunto without departing from the spirit and scope of the invention.

We claim:

1. A circuit for supervising the wear of carbon-brushes normally making contact with a commutator of a direct-current electric motor of an electrically operated vehicle powered by an accumulator, including a main on-off switch for supplying power to said motor, electrically insulated control brushes carried by said carbon-brushes and movable therewith, and a warning signal indicator normally connected to said control brushes to provide a warning signal when said control brushes establish contact with said commutator upon a predetermined degree of wear of said carbon-brushes, said control brushes being connected to a memory means which controls said warning signal indicator and which is set when said control brushes contact said commutator, said memory means upon being set switches on said warning signal indicator independent of said control brushes contacting said commutator, and wherein a reset circuit resets said memory means upon activation of said main on-off switch, said resetting circuit comprising a delay means activated by said main on-off switch being connected to said warning signal indicator, said delay means switching on the warning signal indicator for a predetermined time interval independent of contact between said control brushes and said commutator, and said delay means resetting said memory means.

* * * * *